United States Patent
Park et al.

(10) Patent No.: US 10,211,350 B2
(45) Date of Patent: Feb. 19, 2019

(54) COMPOSITION FOR SOLAR CELL ELECTRODES AND ELECTRODE FABRICATED USING THE SAME

(71) Applicant: SAMSUNG SDI CO., LTD., Yongin-si, Gyeonggi-do (KR)

(72) Inventors: Young Ki Park, Suwon-si (KR); Min Young Lee, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/479,371

(22) Filed: Apr. 5, 2017

(65) Prior Publication Data

US 2018/0102445 A1    Apr. 12, 2018

(30) Foreign Application Priority Data

Oct. 10, 2016 (KR) .................. 10-2016-0130921

(51) Int. Cl.
| | |
|---|---|
| *C03C 8/16* | (2006.01) |
| *H01L 31/0224* | (2006.01) |
| *C03C 8/02* | (2006.01) |
| *C03C 8/10* | (2006.01) |
| *H01B 1/22* | (2006.01) |
| *C03C 3/12* | (2006.01) |
| *C03C 8/18* | (2006.01) |

(52) U.S. Cl.
CPC ...... *H01L 31/022425* (2013.01); *C03C 3/122* (2013.01); *C03C 8/02* (2013.01); *C03C 8/10* (2013.01); *C03C 8/16* (2013.01); *C03C 8/18* (2013.01); *H01B 1/22* (2013.01)

(58) Field of Classification Search
USPC .................... 252/512, 514, 513; 438/98
See application file for complete search history.

(56) References Cited

U.S. PATENT DOCUMENTS

2014/0220732 A1*   8/2014   Liu ................. H01L 31/022425
                                                               438/98

FOREIGN PATENT DOCUMENTS

| | | |
|---|---|---|
| CN | 103377751 A | 10/2013 |
| JP | 2015-144162 A | 8/2015 |
| KR | 10-2016-0083354 A | 7/2016 |
| KR | 10-1655378 B1 | 9/2016 |

OTHER PUBLICATIONS

Ming et al., "Effects of Te-Bi Glass Frit on Performances of Front Silver Contacts for Crystalline Silicon Solar Cells", Journal of Inorganic Materials, vol. 31, Aug. 8, 2016.

* cited by examiner

*Primary Examiner* — Monique R Peets
(74) *Attorney, Agent, or Firm* — Lee & Morse, P.C.

(57) ABSTRACT

A composition for solar cell electrodes and a solar cell electrode fabricated using the composition, the composition including a conductive powder; a glass frit; and an organic vehicle, wherein the glass frit has an initial crystallization temperature of about 300° C. to about 540° C., wherein the glass frit has an A value of about 0.0001 μV/mg·° C. to about 0.2 μV/mg·° C., as calculated by Equation 1:

$$A = \frac{\Delta H}{\Delta T}. \qquad \langle\text{Equation 1}\rangle$$

9 Claims, 3 Drawing Sheets

COMPOSITION FOR SOLAR CELL ELECTRODES AND ELECTRODE FABRICATED USING THE SAME

CROSS-REFERENCE TO RELATED APPLICATION

Korean Patent Application No. 10-2016-0130921, filed on Oct. 10, 2016, in the Korean Intellectual Property Office, and entitled: "Composition for Solar Cell Electrodes and Electrode Fabricated Using the Same," is incorporated by reference herein in its entirety.

BACKGROUND

1. Field

Embodiments relate to a composition for solar cell electrodes and an electrode fabricated using the same.

2. Description of the Related Art

A silicon-based solar cell may be composed of a substrate formed of a p-type silicon semiconductor and an emitter layer formed of an n-type silicon semiconductor. A p-n junction may be formed between the p-type substrate and the n-type emitter layer. When light, e.g., sunlight, is incident on the solar cell having such a structure, electrons may be generated as carriers in the emitter layer formed of the n-type silicon semiconductor and holes may be generated as carriers in the substrate formed of the p-type silicon semiconductor due to the photovoltaic effect. The electrons and holes generated due to the photovoltaic effect may move to a front electrode and rear electrode bonded to upper and lower surfaces of the emitter layer, respectively, and current may flow when these electrodes are connected to each other by a wire. A silver powder paste may be used to form the front electrode.

A glass frit, another component of the silver powder paste, may not only help sinter the electrode, but may also allow the contact of the electrode to be achieved by etching SiNx deposited on the silicon substrate.

SUMMARY

Embodiments are directed to a composition for solar cell electrodes and an electrode fabricated using the same.

The embodiments may be realized by providing a composition for solar cell electrodes, the composition including a conductive powder; a glass frit; and an organic vehicle, wherein the glass frit has an initial crystallization temperature of about 300° C. to about 540° C., wherein the glass frit has an A value of about 0.0001 μV/mg·° C. to about 0.2 μV/mg·° C., as calculated by Equation 1:

$$A = \frac{\Delta H}{\Delta T} \quad \langle \text{Equation 1} \rangle$$

wherein, in Equation 1, $\Delta T$ and $\Delta H$ are calculated using a differential thermal analysis (DTA) curve obtained by DTA analysis of the glass frit at a heating rate of 10° C./min such that $\Delta T$ is a difference, in ° C., between an initial crystallization termination temperature Tcf of the glass frit and a crystallization start temperature Tcs of the glass frit; and $\Delta H$ is a difference, in μV/mg, between values obtained by differentiating the DTA curve at an initial crystallization temperature Tc of the glass frit and the crystallization start temperature Tcs of the glass frit.

The glass frit may have an A value of about 0.0001 μV/mg·° C. to about 0.15 μV/mg·° C., as calculated by the Equation 1, and the glass frit may have an initial crystallization temperature of about 350° C. to about 540° C.

The glass frit may include a crystalline glass frit, the crystalline glass frit including bismuth (Bi) and tellurium (Te).

The crystalline glass frit may further include lead (Pb), lithium (Li), phosphorus (P), germanium (Ge), gallium (Ga), cerium (Ce), iron (Fe), silicon (Si), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), potassium (K), arsenic (As), cobalt (Co), zirconium (Zr), manganese (Mn), aluminum (Al), boron (B), or an oxide thereof.

$\Delta T$ may range from about 30° C. to about 100° C.

The composition may include about 60 wt % to about 95 wt % of the conductive powder; about 0.1 wt % to about 20 wt % of the glass fit; and about 1 wt % to about 30 wt % of the organic vehicle.

The composition may further include a dispersant, a thixotropic agent, a plasticizer, a viscosity stabilizer, an anti-foaming agent, a pigment, a UV stabilizer, an antioxidant, or a coupling agent.

The composition for solar cell electrodes may be applicable to a mono wafer.

The embodiments may be realized by providing a solar cell electrode fabricated using the composition for solar cell electrodes according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
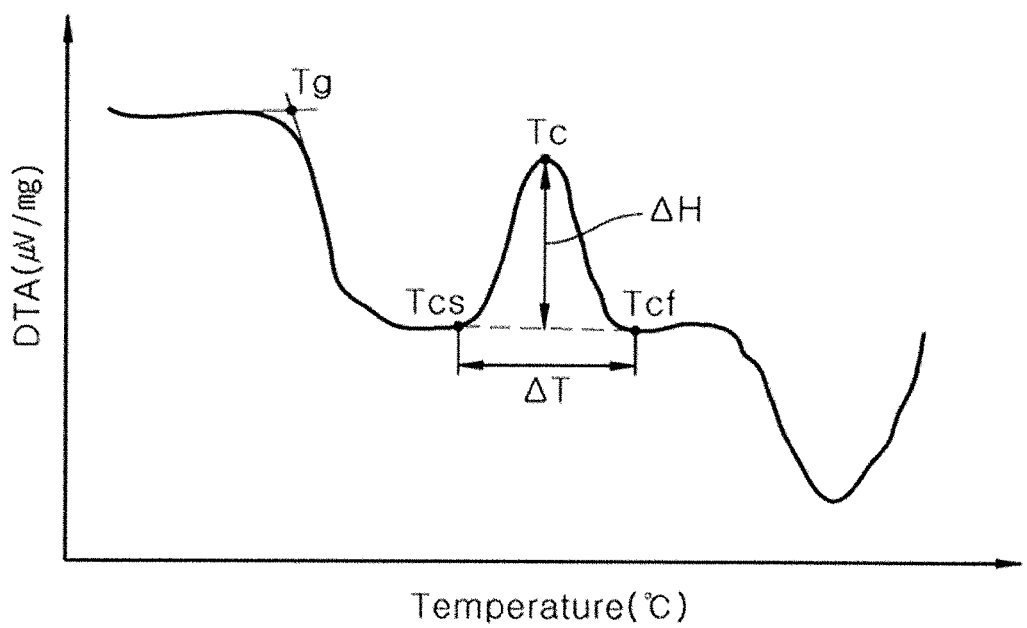
FIG. 1 illustrates a graph showing results of DTA analysis of a glass frit according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

Composition for Solar Cell Electrodes

A composition for solar cell electrodes according to an embodiment may include, e.g., a conductive powder, a glass frit, and an organic vehicle. The glass frit may have an A value of about 0.0001 μV/mg·° C. to about 0.2 μV/mg·° C., as calculated by Equation 1, described below. The glass frit may have an initial crystallization temperature of about 300° C. to about 540° C.

Now, each component of the composition for solar cell electrodes according to an embodiment will be described in more detail.

Conductive Powder

The conductive powder may impart electrical conductivity. The composition for solar cell electrodes may include a metal powder, e.g., silver (Ag) or aluminum (Al) as the conductive powder. In an implementation, the composition for solar cell electrodes may include, e.g., silver powder. The conductive powder may have a nanometer or micrometer-scale particle size. In an implementation, the conductive powder may have a particle size of dozens to several hundred nanometers, or a particle diameter of several to dozens of micrometers. In an implementation, the conductive powder may be a mixture of two or more types of silver powder having different particle sizes.

The conductive powder may have various particle shapes such as a spherical, flake, or amorphous particle shape.

In an implementation, the conductive powder may have an average particle diameter (D50) of about 0.1 μm to about 10 μm, e.g., about 0.5 μm to about 5 μm. Within this range of average particle diameter, it is possible to help reduce contact resistance and line resistance. The average particle diameter may be measured using, e.g., a Model 1064D (CILAS Co., Ltd.) after dispersing the conductive powder in isopropyl alcohol (IPA) at 25° C. for 3 minutes via ultrasonication.

In an implementation, the conductive powder may be present in an amount of about 60 wt % to about 95 wt %, based on a total weight of the composition for solar cell electrodes. Within this range, the composition may help improve conversion efficiency of a solar cell and may be easily prepared in paste form. In an implementation, the conductive powder may be present in an amount of, e.g., about 70 wt % to about 90 wt % based on the total weight of the composition for solar cell electrodes.

Glass Frit

The glass frit may form metal crystal grains in an emitter region by etching an anti-reflection layer and melting the conductive powder during a baking process of the composition for solar cell electrodes. Further, during the baking process, the glass frit may be softened and may decrease the baking temperature.

Differential thermal analysis (DTA) may be conducted on the glass frit at a heating rate of 10° C./min, thereby obtaining a DTA curve wherein the x-axis represents temperature (unit: ° C.) and the y-axis represents voltage (unit: μV), followed by differentiation of the DTA curve. By controlling a value A defined using a difference ΔT (Tcf–Tcs) between an initial crystallization termination temperature Tcf of the glass frit and a crystallization start temperature Tcs of the glass frit and a difference between values obtained by differentiating the DTA curve at an initial crystallization temperature Tc of the glass frit and the crystallization start temperature Tcs of the glass frit, and by controlling the initial crystallization temperature Tc, it is possible to help reduce spreading of an electrode due to high mobility of the glass fit during baking, thereby increasing the open-circuit voltage (Voc) and short-circuit current (Isc) of a solar cell. In Equation 1, the value A indicates the crystallization tendency of the glass frit at high temperature. Thus, a degree of spreading of an electrode may be evaluated by measuring a degree of crystallization-induced mobility of the glass frit at high temperature during baking.

$$A = \frac{\Delta H}{\Delta T} \quad \langle \text{Equation 1} \rangle$$

In Equation 1, ΔT and ΔH are calculated using a differential thermal analysis (DTA) curve obtained by DTA analysis of the glass frit at a heating rate of 10° C./min;

ΔT (unit: ° C.) is a difference between an initial crystallization termination temperature Tcf of the glass frit and a crystallization start temperature Tcs of the glass frit.

ΔH (unit: μV/mg) is a difference between values obtained by differentiating the DTA curve at an initial crystallization temperature Tc of the glass frit and the crystallization start temperature Tcs of the glass frit.

In an implementation, the glass fit may have an A value of, e.g., about 0.0001 μV/mg·° C. to about 0.2 μV/mg·° C., as calculated by Equation 1. Within this range, mobility of the glass fit at high temperature may be controlled to reduce spreading of the glass frit during baking, thereby increasing the short-circuit current (Isc) of a solar cell while suppressing damage to a wafer, thereby increasing the open-circuit voltage (Voc) of the solar cell. In addition, within this range, an effect of increasing the open-circuit voltage (Voc) and short-circuit current (Isc) of a mono wafer or a poly wafer can be obtained, and the effect may be particularly good for a mono wafer.

In an implementation, the glass fit may have an initial crystallization temperature of about 300° C. to about 540° C. Within this range, crystallization of glass may proceed after sufficient contact between an electrode and a wafer is achieved, such that increase in contact resistance due to the crystallization may be prevented.

In an implementation, the glass frit may have an A value of about 0.0001 μV/mg·° C. to about 0.15 μV/mg·° C., e.g., about 0.0001 μV/mg·° C. to about 0.14 μV/mg·° C., as calculated by Equation 1. In an implementation, the glass frit may have an initial crystallization temperature of, e.g., about 350° C. to about 540° C. Within this range, adhesive strength of an electrode may be further improved. In an implementation, an electrode fabricated using the composition for solar cell electrodes according to an embodiment may have an adhesion to a substrate of about 3.0 N/mm or more, e.g., about 3.5 N/mm to about 6.0 N/mm.

In Equation 1, ΔT may range from about 30° C. to about 100° C. Within this range, the glass frit may be crystallized in such a way that spreading of an electrode may be suppressed.

FIG. 1 illustrates a graph showing results of DTA analysis of the glass frit. Referring to FIG. 1, from the DTA results, the initial crystallization temperature Tc, the crystallization start temperature Tcs, and the initial crystallization termination temperature Tcf may be determined, and ΔH at Tc and Tcs may be calculated within ΔT. The graph of FIG. 1 is obtained by differentiating a DTA curve where one crystallization temperature and one crystallization termination temperature appear. In the graph of FIG. 1, Tg means a glass transition temperature of the glass frit.

Figure 2:
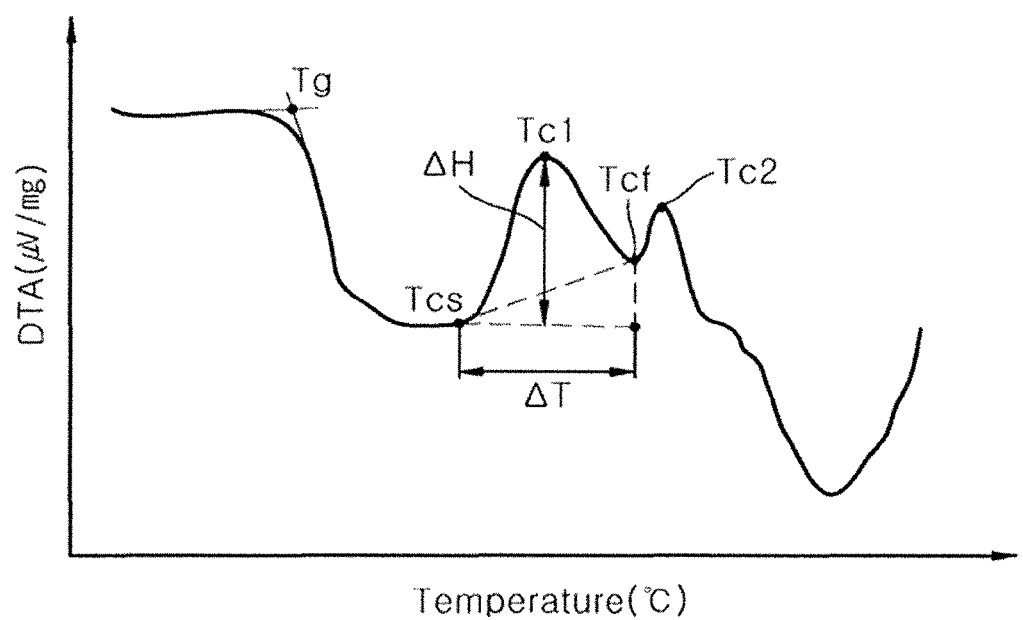
FIG. 2 illustrates a graph showing results of DTA analysis of a glass frit according to another embodiment.

Referring to FIG. 2, when two or more crystallization temperatures, e.g., the crystallization temperature Tc1 and the crystallization temperature Tc2 (Tc1<Tc2), appear on a DTA curve obtained by DTA of the glass frit, ΔH in Equation 1 is calculated using the initial crystallization temperature Tc1, and ΔT in Equation 1 is calculated using the initial crystallization termination temperature Tcf. Here, the initial crystallization termination temperature Tcf appears as an inflection point between the crystallization temperature Tc1 and the crystallization temperature Tc2. In the graph of FIG. 2, Tg means a glass transition temperature of the glass frit.

The glass frit may be a crystalline glass frit including, e.g., bismuth (Bi) and tellurium (Te). The crystalline glass frit may further include, e.g., lead (Pb), lithium (Li), phosphorus (P), germanium (Ge), gallium (Ga), cerium (Ce), iron (Fe), silicon (Si), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), potassium (K), arsenic (As), cobalt (Co), zirconium (Zr), manganese (Mn), aluminum (Al), boron (B), or oxides thereof. In an implementation, the glass frit may include a bismuth-tellurium-based (Bi—Te—O) binary glass frit, a lead-bismuth-tellurium-based (Pb—Bi—Te—O) ternary glass frit, and a lithium-bismuth-tellurium-based (Li—Bi—Te—O) ternary glass frit.

The glass fit may be prepared by a suitable method so long as the glass frit can have a crystallization temperature and an A value as calculated by Equation 1 within the above ranges. For example, the glass fit may be prepared by mixing the above-described components using a ball mill or a planetary mill, melting the mixture at about 900° C. to about 1,300° C., quenching the mixture at about 25° C., followed by pulverizing the obtained product using a disk mill, a planetary mill, or the like.

In an implementation, the glass frit may have an average particle diameter (D50) of about 0.1 μm to about 10 μm, e.g., about 0.5 μm to about 5 μm.

The glass fit may be present in an amount of about 0.1 wt % to about 20 wt %, e.g., about 0.5 wt % to about 10 wt % based on the total weight of the composition for solar cell electrodes. Within this range, the glass frit may help secure stability of a p-n junction under various sheet resistances, minimize resistance, and ultimately improve the efficiency of a solar cell.

Organic Vehicle

The organic vehicle may impart suitable viscosity and rheological characteristics for printing to the composition for solar cell electrodes through mechanical mixing with the inorganic component of the composition.

The organic vehicle may be a suitable organic vehicle used in a composition for solar cell electrodes and may include a binder resin, a solvent, or the like.

The binder resin may be selected from acrylate resins or cellulose resins. Ethyl cellulose may be used as the binder resin. In an implementation, the binder resin may be selected from among ethyl hydroxyethyl cellulose, nitrocellulose, blends of ethyl cellulose and phenol resins, alkyd resins, phenol resins, acrylate ester resins, xylene resins, polybutene resins, polyester resins, urea resins, melamine resins, vinyl acetate resins, wood rosin, polymethacrylates of alcohols, and the like.

The solvent may include, e.g., hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, or ethyl lactate. These may be used alone or as a mixture thereof.

The organic vehicle may be present in an amount of, e.g., about 1 wt % to about 30 wt % based on the total weight of the composition for solar cell electrodes. Within this range, the organic vehicle may help provide sufficient adhesive strength and excellent printability to the composition.

Additives

The composition for solar cell electrodes according to an embodiment may further include suitable additives to enhance fluidity and process properties and stability, as needed. The additives may include, e.g., dispersants, thixotropic agents, plasticizers, viscosity stabilizers, anti-foaming agents, pigments, UV stabilizers, antioxidants, coupling agents, and the like. These additives may be used alone or as mixtures thereof. In an implementation, the additives may be present in an amount of, e.g., about 0.1 wt % to about 5 wt % based on the total weight of the composition for solar cell electrodes.

Solar Cell Electrode and Solar Cell Including the Same

Figure 3:
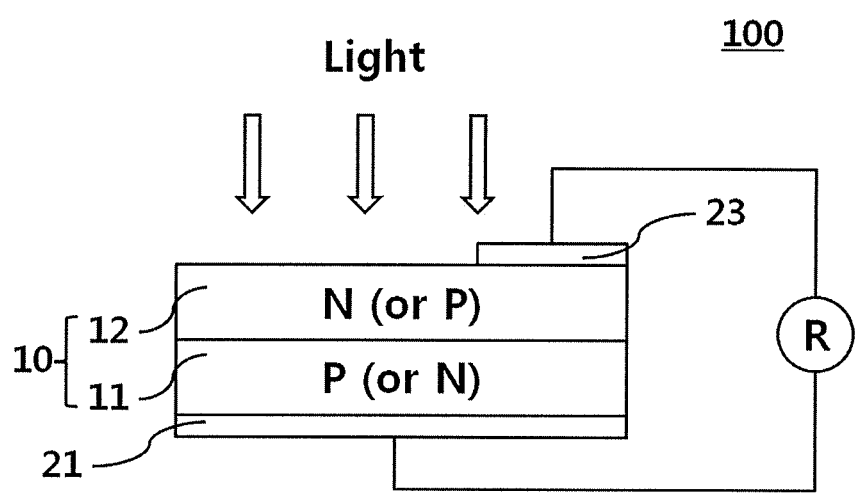
FIG. 3 illustrates a schematic view of a solar cell according to one embodiment.

Other embodiments relate to an electrode formed of the composition for solar cell electrodes and a solar cell including the same. FIG. 3 illustrates a solar cell in accordance with one embodiment.

Referring to FIG. 3, a solar cell according to this embodiment may include, e.g., a substrate 10, a front electrode 23 formed on a front surface of the substrate 10, and a rear electrode 21 formed on a back surface of the substrate 10.

In one embodiment, the substrate 10 may be a substrate with a p-n junction formed thereon. For example, the substrate 10 may include a semiconductor substrate 11 and an emitter 12. For example, the substrate 10 may be a substrate prepared by doping one surface of a p-type semiconductor substrate 11 with an n-type dopant to form an n-type emitter 12. In an implementation, the substrate 10 may be a substrate prepared by doping one surface of an n-type semiconductor substrate 11 with a p-type dopant to form a p-type emitter 12. For example, the semiconductor substrate 11 may be any one of a p-type substrate and an n-type substrate. The p-type substrate may be a semiconductor substrate doped with a p-type dopant, and the n-type substrate may be a semiconductor substrate doped with an n-type dopant.

In the description of the substrate 10, the semiconductor substrate 11, and the like, a surface of such a substrate on which light is incident is referred to as a front surface (light receiving surface). In addition, a surface of the substrate opposite the front surface is referred to as a back surface.

In one embodiment, the semiconductor substrate 11 may be formed of crystalline silicon or a compound semiconductor. For example, the crystalline silicon may be monocrystalline or polycrystalline. As the crystalline silicon, e.g., a silicon wafer may be used.

Here, the p-type dopant may be a material including a group III element such as boron, aluminum, or gallium. In an implementation, the n-type dopant may be a material including a group V element, such as phosphorus, arsenic, or antimony.

The front electrode 23 may be fabricated using the composition for solar cell electrodes according to an embodiment. For example, the front electrode 23 may be fabricated using the composition including silver powder as the conductive powder, and the rear electrode 21 may be fabricated using the composition including aluminum powder as the conductive powder. The front electrode 23 may be formed by printing the composition for solar cell electrodes on the emitter 12, followed by baking, and the rear electrode 21 may be formed by applying the composition for solar cell electrodes to the back surface of the semiconductor substrate 11, followed by baking.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

DTA was performed on glass frits used in Examples and Comparative Examples. Here, DTA was performed on 40 mg of each of the glass frits using a TG/DTA6200 (SII Nano Technology, Japan) at a heating rate of 10° C./min. As a result, a graph where the x-axis represents temperature and the y-axis represents the differential value of DTA results was obtained, as shown in FIG. 1. From the results, the crystallization temperature of the glass frit and the value A in Equation 1 were obtained and shown in Table 1.

forming an $n^+$ layer of $POCL_3$ on the textured surface, and forming an antireflective film of SiNx:H on the $n^+$ layer) by screen printing in a predetermined pattern, followed by drying in an IR drying furnace at 300° C. to 400° C. Then, an aluminum paste was printed on a back surface of the wafer and dried in the same manner as above. A cell formed according to this procedure was subjected to baking at 950° C. for 30 to 50 seconds in a belt-type baking furnace, thereby fabricating a solar cell.

An electrode spreading range of the fabricated solar cell was measured with an optical microscope (Axiotech #451032, Carl Zeiss). In addition, the solar cell was evaluated as to short-circuit current (Isc), open-circuit voltage (Voc) and series resistance (Rs) using a solar cell efficiency tester (CT-801, Pasan Co., Ltd.).

(2) Adhesive Strength

Flux was applied to the prepared front electrode and bonded to a ribbon at 300° C. to 400° C. using a soldering iron (Hakko Co., Ltd.). Then, the resultant was evaluated as to adhesive strength at a peeling angle of 180° and a stretching rate of 50 mm/min using a tensioner (Tinius Olsen) at 25° C.

TABLE 1

| | Glass frit | Glass frit (Product, Manufacturer) | Crystallization temperature (° C.) | A in Equation 1 (μV/mg · ° C.) |
|---|---|---|---|---|
| Comparative Example 1 | Bi—Te—O-based glass (Amorphous) | ABT-1, AGC | — | — |
| Comparative Example 2 | Bi—Te—O-based glass | ABT-1C, AGC | 378 | 0.00005 |
| Comparative Example 3 | Pb—Bi—Te—O-based glass | PBT-27, AGC | 362 | 0.22143 |
| Comparative Example 4 | Pb—Bi—Te—O-based glass | PBT-36, AGC | 478 | 0.00003 |
| Comparative Example 5 | Bi—Te—O-based glass | ABT-8, AGC | 462 | 0.21308 |
| Example 1 | Bi—Te—O-based glass | ABT-103, AGC | 353 | 0.00017 |
| Example 2 | Pb—Bi—Te—O-based glass | PBT-54, AGC | 367 | 0.13529 |
| Example 3 | Pb—Bi—Te—O-based glass | PBT-61, AGC | 412 | 0.08136 |
| Example 4 | Bi—Te—O-based glass | ABT-111, AGC | 433 | 0.07261 |
| Example 5 | Bi—Te—O-based glass | ABT-123, AGC | 456 | 0.00023 |
| Example 6 | Pb—Bi—Te—O-based glass | PBT-70, AGC | 463 | 0.00051 |
| Example 7 | Bi—Te—O-based glass | ABT-129, AGC | 476 | 0.00032 |
| Example 8 | Bi—Te—O-based glass | ABT-202, AGC | 481 | 0.00124 |
| Example 9 | Pb—Bi—Te—O-based glass | PBT-82, AGC | 503 | 0.00012 |
| Example 10 | Pb—Bi—Te—O-based glass | PBT-84, AGC | 532 | 0.00361 |

Examples and Comparative Examples 89 wt % of silver powder (AG-5-11F, Dowa Hightech Co., Ltd., $D_{50}$=1.5 μm), 2 wt % of each of the glass frits, and 1.8 wt % of ethylcellulose (STD4, Dow Chemical Company) as an organic vehicle were added to 7.2 wt % of a solvent Texanol (Eastman Chemical) at 60° C., followed by mixing and kneading in a 3-roll kneader, thereby preparing a composition for solar cell electrodes.

Each of the compositions prepared in Examples and Comparative Examples was evaluated as to the following properties. Results are shown in Table 2.

(1) Electrical Properties

Each of the compositions for solar cell electrodes prepared in Examples 1 to 10 and Comparative Examples 1 to 5 was deposited over a front surface of a wafer (a mono wafer (average sheet resistance: 80Ω) prepared by texturing a front surface of a p-type wafer doped with boron (B),

TABLE 2

| | Electrode spreading range (μm) | Voc (mV) | Isc (A) | Rs (mΩ) | Adhesive strength (N/mm) |
|---|---|---|---|---|---|
| Comparative Example 1 | 21.3 | 635.3 | 9.412 | 4.12 | 2.8 |
| Comparative Example 2 | 18.4 | 634.9 | 9.418 | 4.21 | 2.7 |
| Comparative Example 3 | 0 | 633.4 | 9.436 | 6.23 | 2.5 |
| Comparative Example 4 | 20.1 | 635.4 | 9.409 | 4.39 | 2.6 |
| Comparative Example 5 | 0 | 635.1 | 9.441 | 6.33 | 2.7 |
| Example 1 | 11.2 | 636.9 | 9.429 | 4.32 | 4.1 |
| Example 2 | 5.4 | 637.2 | 9.436 | 4.16 | 4.2 |
| Example 3 | 7.4 | 637.1 | 9.435 | 4.23 | 4.1 |
| Example 4 | 6.2 | 636.7 | 9.435 | 4.31 | 4.6 |

TABLE 2-continued

|  | Electrode spreading range (μm) | Voc (mV) | Isc (A) | Rs (mΩ) | Adhesive strength (N/mm) |
|---|---|---|---|---|---|
| Example 5 | 7.2 | 637.5 | 9.438 | 4.18 | 4.3 |
| Example 6 | 5.3 | 637.4 | 9.436 | 4.41 | 4.8 |
| Example 7 | 5.9 | 637.8 | 9.437 | 4.25 | 4.1 |
| Example 8 | 3.1 | 636.7 | 9.441 | 4.28 | 5.3 |
| Example 9 | 4.9 | 637.4 | 9.431 | 4.32 | 4.5 |
| Example 10 | 3.6 | 637.6 | 9.438 | 4.11 | 4.7 |

As shown in Table 2, it may be seen that the compositions for solar cell electrodes according to Examples 1-10 exhibited increased open-circuit voltage (Voc) and short-circuit current (Isc) and reduced series resistance (Rs) by reducing the electrode spreading range. In addition, the compositions for solar cell electrodes according to the Examples 1-10 exhibited improved adhesion of the electrodes to the substrate.

Thus, according to an embodiment, it is possible to provide a composition for solar cell electrodes that may help suppress spreading of an electrode during baking, thereby increasing the open-circuit voltage (Voc) and short-circuit current (Isc) of a solar cell. In addition, according to an embodiment, it is possible to provide a composition for solar cell electrodes that may exhibit high adhesion to a substrate. Further, according to an embodiment, it is possible to provide a composition for solar cell electrodes that may help reduce the series resistance (Rs) of a solar cell. Moreover, according to an embodiment, it is possible to provide a solar cell electrode formed of the composition for solar cell electrodes as set forth above.

Conversely, in Comparative Example 1 using amorphous glass, the crystallization temperature of the glass could not be determined, and the value of A in Equation 1 could not be defined and spreading of the electrodes was severe, causing reduction in open-circuit voltage (Voc) and short-circuit current (Isc). In addition, in Comparative Examples 2 and 4 (in which the value of A in Equation 1 was less than 0.0001), spreading of the electrode was severe, causing reduction in the open-circuit voltage (Voc) and the short-circuit current (Isc). In Comparative Example 3 and 5 (in which the value of A in Equation 1 exceeded 0.2), the solar cell had low open-circuit voltage (Voc) and high series resistance (Rs) despite insignificant electrode spreading. Further, all of the compositions for solar cell electrodes of Comparative Examples 1 to 5 exhibited considerably low adhesion to the substrate, as compared with the compositions for solar cell electrodes of Examples 1-10.

By way of summation and review, glass frit could liquefy and flow during baking at high temperature. A glass frit that has higher mobility at high temperature may more easily spread around an edge of the electrode, causing reduction in open-circuit voltage (Voc) and short-circuit current (Isc) of the solar cell.

In order to help suppress spreading of a glass frit during baking, inorganic fillers could be used, or a paste composition could be designed to have a high viscosity at high temperature to reduce mobility of the glass frit when glass is liquefied at high temperature. However, for contact between a silicon wafer and an electrode during baking, a paste composition should be sufficiently low in viscosity when liquefied to be uniformly present between the wafer and the electrode at a certain temperature. In addition, inorganic fillers could also interfere with contact of an electrode.

It may be desirable for a glass frit to be present in a crystallized state in a certain temperature range to help suppress spreading of an electrode. If the degree of crystallization of a glass frit were to be too high, reactivity of the glass frit with SiNx on a surface of a wafer could be reduced, such that etching may not be properly achieved, causing interference with an electrode contact.

The embodiments may provide a composition for solar cell electrodes that may help control spreading of an electrode during baking by controlling mobility of a glass frit used in a baked composition for solar cell electrodes at high temperature, e.g., at a baking temperature, thereby increasing the open-circuit voltage (Voc) and short-circuit current (Isc) of a solar cell and improving adhesion of the electrode to a substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for solar cell electrodes, the composition comprising:
a conductive powder;
a glass fit; and
an organic vehicle,
wherein the glass frit has an initial crystallization temperature of about 300° C. to about 540° C.,
wherein the glass frit has an A value of about 0.0001 μV/mg·° C. to about 0.2 μV/mg·° C., as calculated by Equation 1:

$$A = \frac{\Delta H}{\Delta T} \quad \langle \text{Equation 1} \rangle$$

wherein, in Equation 1, ΔT and ΔH are calculated using a differential thermal analysis (DTA) curve obtained by DTA analysis of the glass frit at a heating rate of 10° C./min such that:
ΔT is a difference, in ° C., between an initial crystallization termination temperature Tcf of the glass frit and a crystallization start temperature Tcs of the glass fit; and
ΔH is a difference, in μV/mg, between values obtained by differentiating the DTA curve at an initial crystallization temperature Tc of the glass frit and the crystallization start temperature Tcs of the glass fit.

2. The composition for solar cell electrodes as claimed in claim 1, wherein:
the glass frit has an A value of about 0.0001 μV/mg·° C. to about 0.15 μV/mg·° C., as calculated by the Equation 1, and
the glass frit has an initial crystallization temperature of about 350° C. to about 540° C.

3. The composition for solar cell electrodes as claimed in claim 1, wherein the glass frit includes a crystalline glass frit, the crystalline glass frit including bismuth (Bi) and tellurium (Te).

4. The composition for solar cell electrodes as claimed in claim 3, wherein the crystalline glass frit further includes lead (Pb), lithium (Li), phosphorus (P), germanium (Ge), gallium (Ga), cerium (Ce), iron (Fe), silicon (Si), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), potassium (K), arsenic (As), cobalt (Co), zirconium (Zr), manganese (Mn), aluminum (Al), boron (B), or an oxide thereof.

5. The composition for solar cell electrodes as claimed in claim 1, wherein $\Delta T$ ranges from about 30° C. to about 100° C.

6. The composition for solar cell electrodes as claimed in claim 1, wherein the composition includes:
   about 60 wt % to about 95 wt % of the conductive powder;
   about 0.1 wt % to about 20 wt % of the glass frit; and
   about 1 wt % to about 30 wt % of the organic vehicle.

7. The composition for solar cell electrodes as claimed in claim 1, further comprising a dispersant, a thixotropic agent, a plasticizer, a viscosity stabilizer, an anti-foaming agent, a pigment, a UV stabilizer, an antioxidant, or a coupling agent.

8. The composition for solar cell electrodes as claimed in claim 1, wherein the composition for solar cell electrodes is applicable to a mono wafer.

9. A solar cell electrode fabricated using the composition for solar cell electrodes as claimed in claim 1.

* * * * *